United States Patent
Jindal

(10) Patent No.: US 9,213,063 B2
(45) Date of Patent: Dec. 15, 2015

(54) RESET GENERATION CIRCUIT FOR SCAN MODE EXIT

(71) Applicant: Anurag Jindal, Patiala (IN)

(72) Inventor: Anurag Jindal, Patiala (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 134 days.

(21) Appl. No.: 14/225,446

(22) Filed: Mar. 26, 2014

(65) Prior Publication Data

US 2015/0276866 A1    Oct. 1, 2015

(51) Int. Cl.
    *G01R 31/3185* (2006.01)

(52) U.S. Cl.
    CPC *G01R 31/318583* (2013.01); *G01R 31/318555* (2013.01)

(58) Field of Classification Search
    None
    See application file for complete search history.

(56) References Cited

U.S. PATENT DOCUMENTS

| 5,134,587 A | 7/1992 | Steele |
| 5,365,481 A | 11/1994 | Sawada |
| 6,650,594 B1 | 11/2003 | Lee |
| 6,804,802 B1 * | 10/2004 | Lulla et al. ............. 714/727 |
| 7,196,966 B2 | 3/2007 | Jin |
| 2002/0193960 A1 * | 12/2002 | Amirfathi ............. 702/120 |
| 2013/0085704 A1 * | 4/2013 | Stanley et al. ............. 702/118 |
| 2013/0328583 A1 * | 12/2013 | Wada et al. ............. 324/750.3 |

OTHER PUBLICATIONS

Ehrenberg, Heiko, Test Mode Entry and Exit Methods for IEEE P1581 compliant devices, International Test Conference, IEEE 2008.
Ehrenberg, Heiko, Russell, Bob, and Van Treuren, Bradford, IEEE P1851—Getting More Board Test Out of Boundary Scan, International Test Conference, IEEE 2006.

* cited by examiner

*Primary Examiner* — April Y Blair
*Assistant Examiner* — Thien D Nguyen
(74) *Attorney, Agent, or Firm* — Charles Bergere

(57) ABSTRACT

A reset generation circuit of an integrated circuit uses a scan data input pin as a scan mode exit control, which is enabled only when the IC reset pin of the device is active. The reset generation circuit allows a TAP controller to be scan testable yet at the same time the circuit provides a method to exit scan mode without requiring a power-up sequence or an extra pin.

13 Claims, 3 Drawing Sheets

PRIOR ART

RESET GENERATION CIRCUIT FOR SCAN MODE EXIT

BACKGROUND OF THE INVENTION

The present invention is directed to integrated circuits and, more particularly, to an integrated circuit with a reset generation circuit for scan mode exit.

Integrated circuits (ICs) are commonly tested using automatic test equipment (ATE) during manufacture to detect hardware defects. A device under test (DUT) may have design-for-testability (DFT) features that facilitate the automatic testing. The DFT features often include scan test registers that are connected in one or more scan chains to test the functionality of the registers as well as to gain access to internal nodes of the IC. Test patterns are shifted into the IC through the scan chains during test mode operation. The DUT is returned to functional operation during one or more capture clock cycles, and the resulting signals are shifted out through the scan chains and checked against valid outputs.

One industry standard that is widely used in automatic testing of ICs (and other circuits) is the Joint Test Action Group (JTAG) standard IEEE 1149.1 Standard Test Access Port and Boundary-Scan Architecture. A device that complies with the JTAG standard has a JTAG interface with a test access port (TAP) controller and a TAP that has four pins to which the ATE is connected and that are necessarily present (test data in—TDI, test data out—TDO, test clock—TCK, and test mode select—TMS). A fifth, test reset PIN (TRST*) is optional and enables the JTAG interface registers to be cleared asynchronously, for example, after running one test pattern and before starting another. The JTAG interface is often also used in debugging software and may be used in development environments for embedded software.

It is important to reduce the number of external pins or leads on ICs, especially for some types of devices. It is desirable to be able to reset test configurations without a dedicated test reset pin (such as TRST*).

A power on reset signal (POR_B) is typically generated by an IC when power is applied to it, after a phase where the power was down, to reset the test configurations. One conventional technique of resetting test configurations without a dedicated test reset pin includes instructions in the test program between different test patterns to interrupt the power supply to the DUT to exit the test program. The power supply is then re-established by the ATE and the power on reset signal POR_B clears the test registers (as opposed to clearing the registers with the TRST* pin, when the pin is not provided). However, the time for the power down to clear the registers and for the ensuing power-up to re-establish stable operation is non-trivial. Moreover, this type of reset may need to be performed frequently during testing, which significantly prolongs the overall test time.

A conventional technique for test reset keeps the JTAG controller (or other test controller) completely out of the scan. However, in that case the JTAG interface itself cannot be tested by the scan coverage, which leaves the risk of undetected defects in the JTAG interface. Since the JTAG controller needs to be active during scan mode, the four JTAG pins TDI, TDO, TCK and TMS cannot be reused for scan chain operations.

Another conventional technique enables test mode to be entered, exited and reset by a series of over voltage excursions, and test mode exit being enabled by a chip enable signal. However, this technique cannot be used for ICs that require a high immunity to noise and interference.

IEEE standard 1581 defines a method for testing the interconnection of discrete, complex memory ICs where additional pins for testing are not available. However, IEEE 1581 does not provide a solution to the issues discussed above. Thus, it would be advantageous to have an IC in which the JTAG controller is covered by scan, yet the IC does not require a separate test reset pin.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

DETAILED DESCRIPTION

Figure 1:
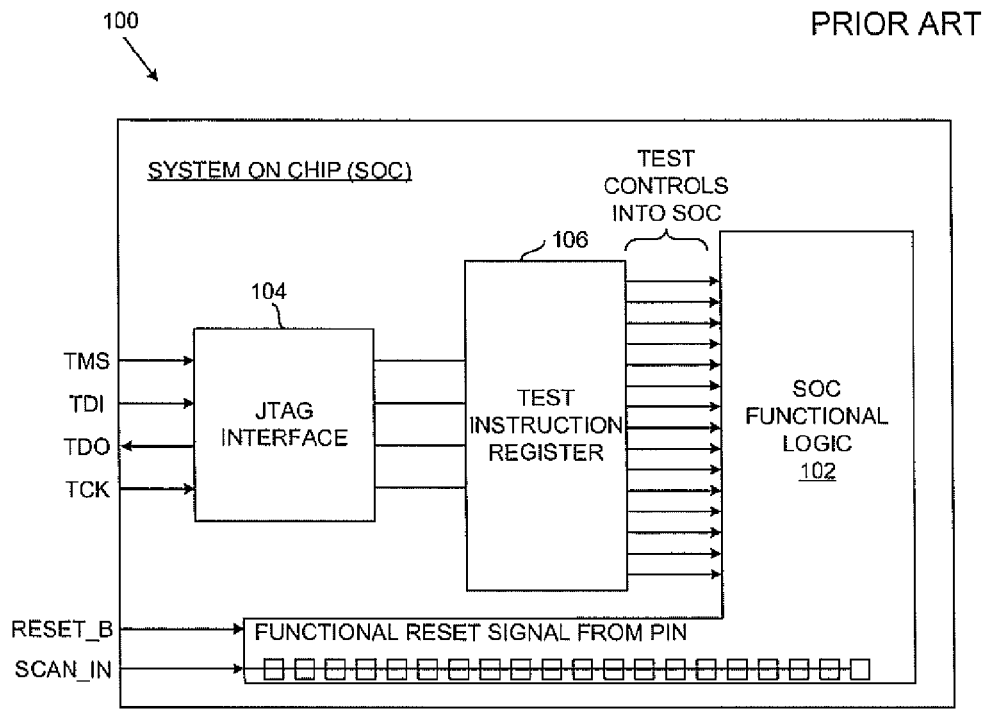
FIG. 1 is a schematic block diagram of a conventional integrated circuit (IC) with a JTAG interface.

FIG. 1 illustrates a conventional integrated circuit (IC) 100 having processors, memory and other elements (not shown) forming functional logic for a system on chip (SOC) 102. The IC 100 includes a JTAG interface 104 compliant with standard IEEE 1149.1 Standard Test Access Port and Boundary-Scan Architecture. The JTAG interface 104 has a test access port (TAP) with four pins to which ATE (not shown) is connected during test operation using TDI, TDO, TCK, and TMS, as is know by those of skill in the art. The default values of the TMS and TDI are high, in the absence of drive on the pin. The JTAG interface 104 does not have a test reset pin TRST*, specified in the standard IEEE 1149.1 as optional, in order to reduce the number of external pins or leads on the IC 100. The standard IEEE 1149.1 uses the convention X* to designate a signal X that is active low, that is to say asserted when it is low; herein the convention X_B may be used for the same signal.

Figure 2:
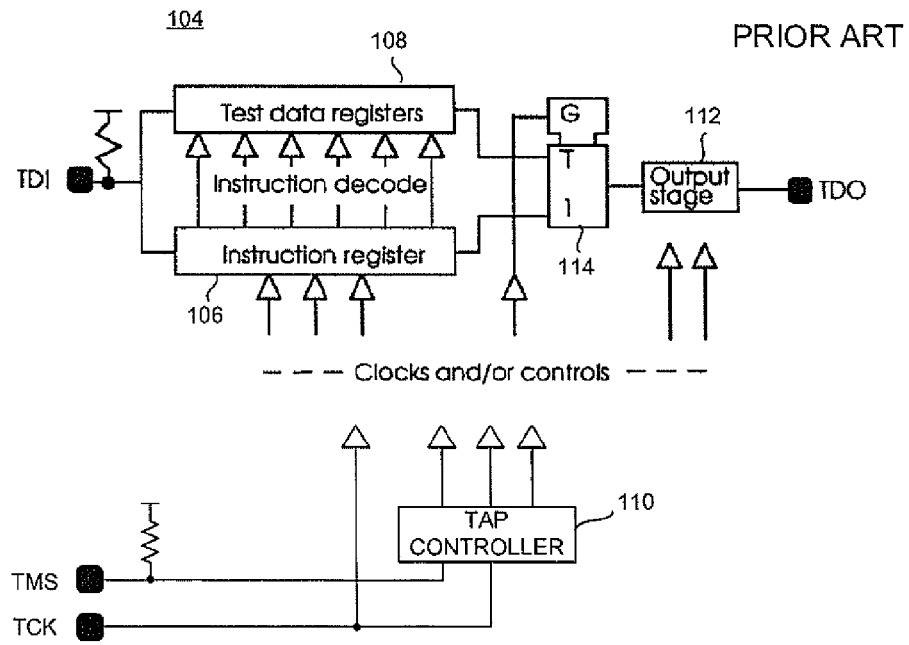
FIG. 2 is a schematic block diagram of test logic compliant with the JTAG standard IEEE 1149.1, of the IC of FIG. 1.

FIG. 2 is a schematic diagram of test logic compliant with the JTAG standard IEEE 1149.1 of the IC 100. As shown in FIGS. 1 and 2, the JTAG interface 104 has a test instruction register 106, which receives from the TDI pin codes representing test pattern instructions that control scan tests of the IC 100. The JTAG interface 104 also has test data registers 108 that receive from the TDI pin codes representing test data used during the scan tests under the control of the instruction register 106. The JTAG interface 104 also has a TAP controller 110 that receives from the TMS pin codes controlling the test mode, and test clock signals from the TCK pin. An output stage 112 transmits output signals from the JTAG interface 104 to the TDO pin, either from the test data registers 108, which may be serial signals, or from the test instruction register 106, in compliance with paragraph 6.1.1.d of the IEEE standard 1149.1. As previously discussed, frequently, test patterns used require the configuration of the instruction register 106, and in some cases also of the test data registers 108, to be reset before passing to the next test pattern.

Also as previously discussed, it is important for the JTAG interface 104 to be covered by the scan logic so that defects associated with the JTAG interface 104 can be detected.

Accordingly the TDI, TMS (or TCK, TDO) pins cannot be used to reset the instruction register 106 during scan test mode operation.

An instruction can be included in the test program to power down the DUT. The ATE can subsequently power up the DUT again, the power up sequence including a power on reset signal (POR_B) generated by hardware in the IC 100, which resets the IC 100 including the instruction register 106 and the test data registers 108. However, the time taken for powering down and up again is substantial, amounting to several hundred milliseconds typically for each test insertion, depending on the circuit involved.

Embodiments of the present invention enable the test mode operation of a DUT to be exited and the test instruction register(s) of the DUT to be reset without a dedicated test reset pin, without excluding the JTAG interface from the scan logic, without interrupting the power supply to the DUT, without using pins of the JTAG interface for this purpose during test scan, and without using values of signals or combinations of signals applied that involve a risk of appearing in functional operation and inadvertently causing the device to enter test mode.

Figure 3:
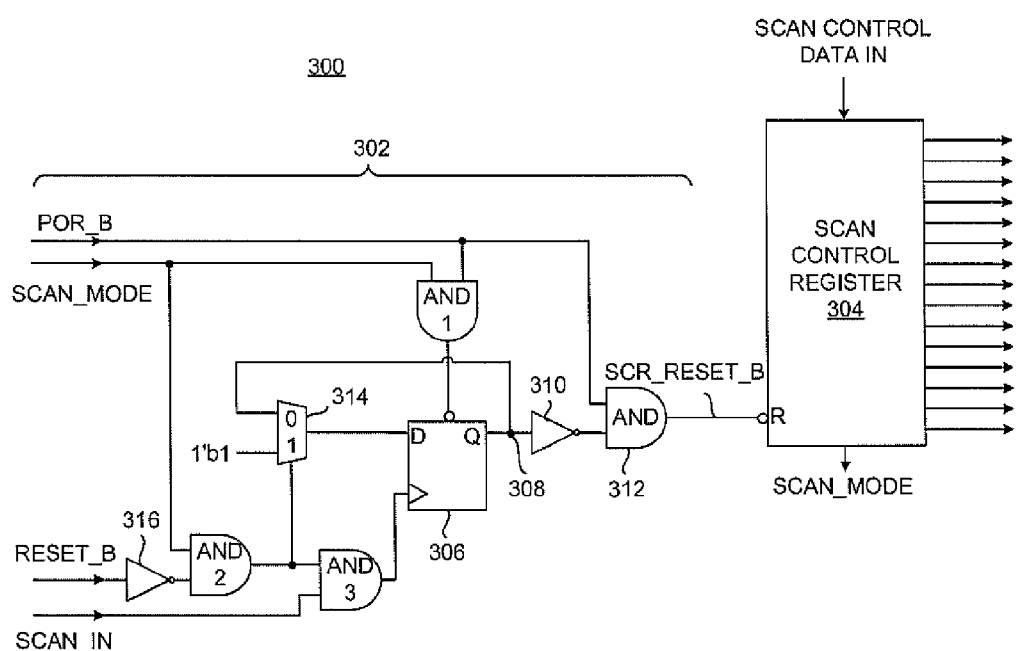
FIG. 3 is a schematic block diagram of a reset generation circuit of an IC in accordance with an embodiment of the present invention.

Referring now to FIG. 3, a schematic diagram of an IC 300 in accordance with an embodiment of the present invention is shown. The IC 300 includes similar elements to the IC 100 shown in FIGS. 1 and 2 but also includes a reset generation circuit 302. The reset generation circuit 302 receives the power on reset POR_B signal as an input. The reset generation circuit 302 also receives as inputs from the ATE, through functional pins, the signal RESET_B, which is a reset signal used in normal functional mode operations, and a signal SCAN_IN for inputting serial scan data into the scan chains. The IC 300 includes a scan control register 304, which is one of the test data registers 108. Typically, a scan control register controls the entry into scan mode, configures the scan chains, and controls the clock and reset signals used during scan testing. The reset generation circuit 302 also receives from the scan control register 304 a SCAN_MODE signal, whose value is asserted during scan testing and de-asserted on reset of the test data registers 108. In this example, the SCAN_MODE signal comes from the LSB of the output of the scan control register 304.

In compliance with IEEE 1149.1, when the IC 300 is in the Test-Logic-Reset controller state, the scan test mode is disabled, enabling the IC 300 to operate in its normal functional mode. When the IC 300 enters the Test-Logic-Reset state under control of TMS and TCK before test mode operation, for example after power up, the contents of the instruction register 106 and the test data registers 108, including the scan control register 304 are reset by assertion (low) of the POR_B signal.

In this embodiment of the present invention, the reset generation circuit 302 enables the scan control register 304 to be reset while in scan test mode without the IC 300 being powered down and up again and without using the TDI or TMS pins to activate the reset during the scan test mode. The test instructions are entered by the ATE at the TDI pin, and stored in the instruction register 106. Test data is also entered using the TDI pin and stored in the test data registers 108. The scan test is then launched by a signal from the ATE on the TMS pin. The JTAG interface 104 is not active during the scan test and thus may be subjected to the test. During the scan test, the SCAN_IN signal is used to input data used for the scan test.

In test of the IC 300, the TAP controller 110 resets outputs of the test instruction register 106 when the test logic is in a Test-Logic-Reset state (in compliance with the standard IEEE 1149.1). The reset generation circuit 302 resets the scan control register 304 and disables the test logic when the test logic is in test mode (whatever the state of the TAP controller 110, which is part of the scan chain). The reset generation circuit 302 applies a reset signal (SCR_RESET_B) to the scan control register 304 when the RESET_B signal (asserted low) and a de-assertion (low), followed by re-assertion, of the data input signal SCAN_IN from the ATE.

The data input signal SCAN_IN remains available for enabling data input during normal scan mode operation while the RESET_B signal is de-asserted (high). The conjunction of assertion of the RESET_B signal (low) and de-assertion (low) followed by assertion (high) of the data input signal SCAN_IN does not occur during the normal scan test patterns. The use of this particular conjunction of SCAN_IN and RESET_B signal states therefore avoids risk of unintentional scan test mode exit.

The reset generation circuit 302 may reset the scan control register 304 and disable the test logic asynchronously. The reset generation circuit 302 receives, from the scan control register 304, a SCAN_MODE signal, which is asserted when the test logic is enabled, and in that case the SCAN_MODE signal may be asserted when the TAP controller 110 is in a state other than Test-Logic-Reset.

Referring again to FIG. 3, the reset generation circuit 302 includes a flip-flop 306 that latches a signal at its Q output on a node 308. The signal at the node 308 is input to an inverter 310 and then to an input of an AND gate 312. The AND gate 312 generates a low active output SCR_RESET_B, which is applied to a reset input of the scan control register 304 (and if desired to the test data registers 108). The other input of the AND gate 312 receives the power on reset POR_B to reset the scan control register 304 during power up (when POR_B is asserted), irrespective of the value of SCR_RESET_B.

The reset generation circuit 302 has a first AND gate AND1 that has an output connected to an active low reset input of the flip-flop 306. The first AND gate AND1 receives on its inputs the power on reset POR_B signal and the SCAN_MODE signal from the serial output of the scan control register 304, whose value is asserted during scan test and de-asserted on reset of the scan control register 304.

The output of the flip-flop 306 is latched, to avoid glitches that could cause the IC 300 to exit scan test mode unintentionally, by feedback from its Q output through a 0 input of a multiplexer (MUX) 314, whose output is connected to the D input of the flip-flop 306. The other input of the MUX 314 is tied high, that is, it receives a constant binary 1 signal. The control input of the MUX 314 is connected to the output of a second AND gate AND2. The second AND gate AND2 has inputs connected to receive the RESET_B signal (i.e., the functional mode reset signal) by way of an inverter 316, and the SCAN_MODE signal from the serial output of the scan control register 304.

The flip-flop 306 has a trigger input connected to the output of a third AND gate AND3. The third AND gate AND3 receives as inputs the output of the second AND gate AND2, and the SCAN_IN signal.

Figure 4:
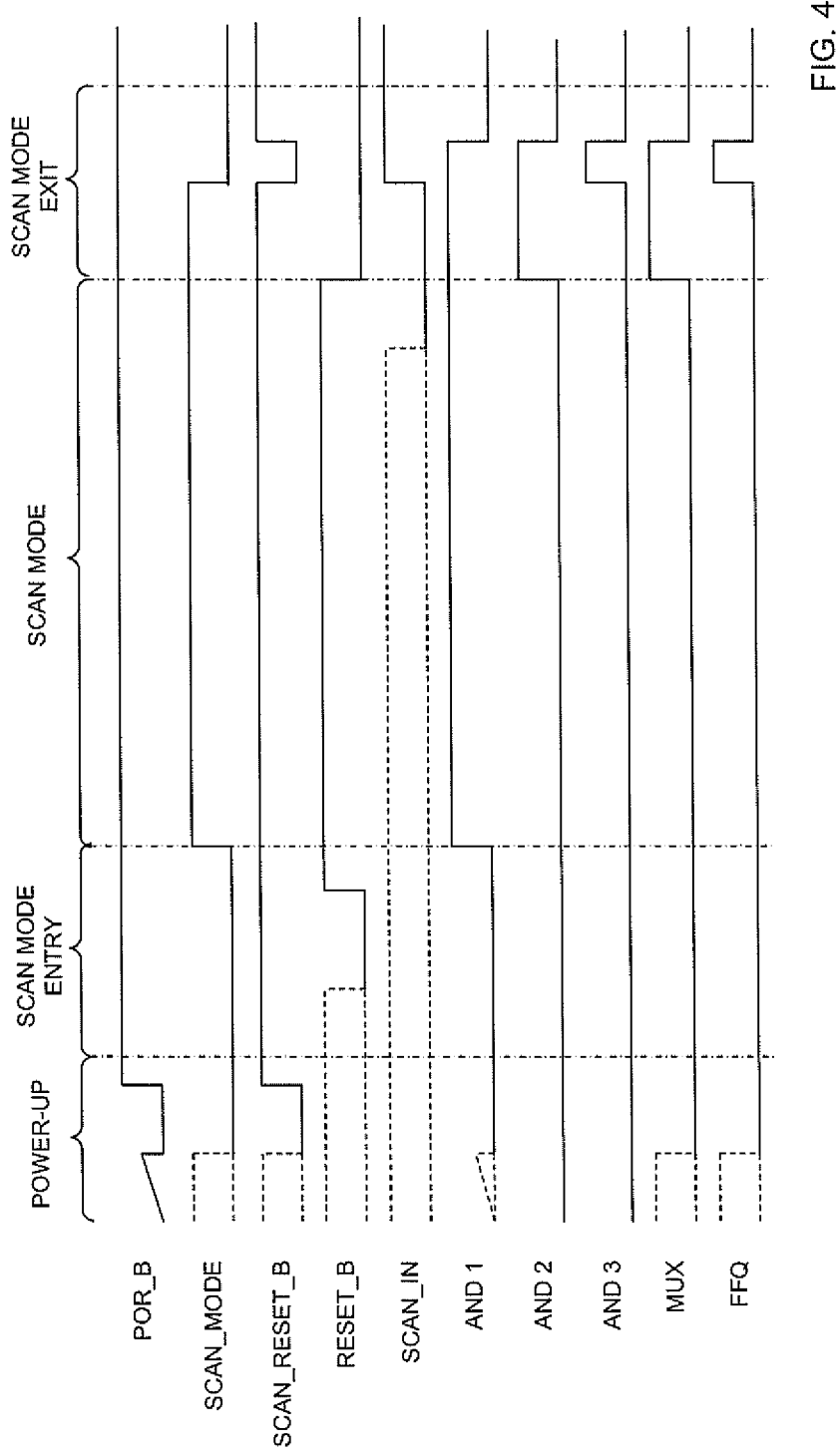
FIG. 4 is a graph of signals of the reset generation circuit FIG. 3 against time.

FIG. 4 is a graph illustrating signals appearing in a test operation of the IC 300. Dashed lines represent signal values that are uncertain or indifferent. Initially, during a power up phase, the power on reset signal POR_B is de-asserted (goes high), then is re-asserted (goes low) to provide an initial reset to the values in the registers 106 and 108. Re-assertion of POR_B de-asserts (low) the output of the AND gate 312, which is applied to the reset input of the scan control register 304 (and the other test data registers 108) and resets them. The power on reset signal POR_B is then de-asserted (high) by the ATE and remains de-asserted until the test operation is complete.

During the next phase, scan mode entry, the SCAN_MODE signal from the scan control register 304 is de-asserted, since the content of the scan control register 304 has been reset. The output of the first AND gate AND1 is also de-asserted, ensuring that the flip-flop 306 remains reset. The signal RESET_B from the ATE is asserted, keeping the output of the second AND gate AND2 de-asserted until the signal RESET_B is then de-asserted by the ATE.

The scan test mode phase then begins, with instructions and test data loading into the registers 106 and 108 from the ATE through the TDI pin. The SCAN_MODE signal is only asserted after loading scan instruction data into the scan control register 304. The RESET_B signal is de-asserted for the entire scan test mode phase. Consequently, the inverter 316 holds the output of the second AND gate AND2 de-asserted. The output of the MUX 314 is equal to the feedback at its 0 input from the Q output of the flip-flop 306, which is de-asserted at the start of the scan test mode phase by the initial reset of the flip-flop 306 and remains de-asserted during the scan test mode phase.

At the end of the scan test mode phase, the RESET_B signal is re-asserted but a constraint is put on the value of the SCAN_IN signal, which may only be de-asserted at this time. The output of the second AND gate AND2 is asserted, due to the inverter 316. The output of the MUX 314 goes high, equal to its 1 input, and this value is applied to the D input of the flip-flop 306. However, the flip-flop 306 cannot toggle because the input from the third AND gate AND3 to its trigger input is de-asserted.

The scan test mode exit phase is triggered by assertion of the signal SCAN_IN. Assertion of the output of the gate AND3 triggers toggling of the output of the flip-flop 306, which becomes asserted. De-assertion of the output of the inverter 310 causes the AND gate 312 to de-assert its active low output SCR_RESET_B, which resets the values in the scan control register 304. When the data in the scan control register 304 is reset, the signal SCAN-MODE is de-asserted. The signal SCAN-MODE de-asserts the output of the gates AND1, AND2 and AND3. De-asserting the output of the gate AND1 resets the flip-flop 306 so that its Q output is de-asserted. The inverter 310 asserts its output at the input of the AND gate 312, whose output is asserted (as long the power on reset signal POR_B is de-asserted high) leaving the scan control register 304 ready for fresh data after the reset, without power down.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Similarly, any arrangement of components to achieve the same functionality is effectively 'associated' such that the desired functionality is achieved. Hence, any two components combined to achieve a particular functionality can be seen as 'associated with' each other such that the desired functionality is achieved, irrespective of architectures or intermediate components. Likewise, any two components so associated can also be viewed as being 'operably connected' or 'operably coupled' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type. Thus, the invention is not limited to physical devices or units implemented in non-programmable hardware but can also be applied in programmable devices or units able to perform the desired device functions by operating in accordance with suitable program code.

In the claims, the word 'comprising' or 'having' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit (IC) including functional signal pins and test logic, the IC comprising:
   at least one test instruction register, and a plurality of test data registers including a scan control register;
   a test access port (TAP) controller that resets outputs of the test instruction register when the test logic is in a Test-Logic-Reset state;
   a TAP having pins for connection to automatic test equipment (ATE) for input and output signals to and from the TAP controller, the test instruction register and the test data registers; and
   a reset generation circuit that resets the scan control register when the test logic is in test mode and receives a conjunction of a RESET_B signal on at least one of the functional signal pins and a data input signal from the ATE on at least one other of the functional signal pins, wherein the reset generation circuit receives from the test instruction register a scan mode signal that is asserted when the test logic is enabled.

2. The integrated circuit of claim 1, wherein the data input signal is provided from the ATE during test operation and is a functional data input during normal functional operation.

3. The integrated circuit of claim 1, wherein the reset generation circuit resets the test instruction register and disables the test logic asynchronously.

4. The integrated circuit of claim 1, wherein the scan mode signal is asserted when the TAP controller is in the state other than Test-Logic-Reset.

5. The integrated circuit of claim 1, wherein the TAP, the TAP controller, the test instruction register and the test data register are compliant with the standard IEEE 1149.1, at least apart from the reset generation circuit resetting the test instruction register and disabling the test logic when the TAP controller is in the state other than the Test-Logic-Reset state.

6. The integrated circuit of claim 1, wherein the reset generation circuit comprises:
   a first AND gate that receives a scan mode signal (SCAN_MODE) and a power on reset signal (POR_B);
   a second AND gate that receives the SCAN_MODE signal and the RESET_B signal;
   a third AND gate that receives an output of the second AND gate and a scan data in signal (SCAN_IN);
   a flip-flop having a data input, a clock input connected to an output of the third AND gate, a reset input connected to an output of the first AND gate, and an output;
   a multiplexer having a first input connected to the output of the flip-flop, a second input tied high, an output connected to the data input of the flip-flop, and a control input connected to the output of the second AND gate; and
   a fourth AND gate having a first input that receives the POR_B signal, a second input connected to the output of the flip-flop, and an output used to reset the scan control register.

7. The integrated circuit of claim 6, wherein the reset generation circuit further comprises a first inverter connected between the output of the flip-flop and the second input of the fourth AND gate.

8. The integrated circuit of claim 7, wherein the reset generation circuit further comprises a second inverter connected to one of the inputs of the second AND gate for inverting the RESET_B signal before it is input to the second AND gate.

9. A method of testing an integrated circuit (IC) including functional signal pins and test logic comprising at least one test instruction register and at least one test data register, a test access port (TAP) controller, a TAP having pins for connection to automatic test equipment (ATE) for input and output signals to and from the TAP controller, the test instruction register and the test data register, and a reset generation module, wherein the method comprises:
   a RESET_B signal on at least one of the functional signal pins causing the TAP controller to reset outputs of the test instruction register when the test logic is in a Test-Logic-Reset state;
   the reset generation module resetting the test instruction register and disabling the test logic when the TAP controller is in test mode in a state other than Test-Logic-Reset and receives a conjunction of the RESET_B signal and a data input signal from the ATE on at least one other of the functional signal pins; and
   the reset generation module receives from the test instruction register a scan mode signal that is asserted when the test logic is enabled.

10. The method of claim 9, wherein the data input signal is provided from the ATE during test operation and is a functional data input during normal functional operation.

11. The method of claim 9, wherein the reset generation module resets the test instruction register and disables the test logic asynchronously.

12. The method of claim 9, wherein the scan mode signal is asserted when the TAP controller is in the state other than Test-Logic-Reset.

13. The method of claim 9, wherein the TAP, the TAP controller, the test instruction register and the test data register are compliant with the standard IEEE 1149.1, at least apart from the reset generation module resetting the test instruction register and disabling the test logic when the TAP controller is in the state other than Test-Logic-Reset.

* * * * *